(12) United States Patent
Kim et al.

(10) Patent No.: US 6,744,317 B2
(45) Date of Patent: Jun. 1, 2004

(54) DIGITAL LINEARIZER OF HIGH POWER AMPLIFIER AND DIGITAL LINEARIZING METHOD

(75) Inventors: Woo Sik Kim, Seoul (KR); Dae Weon Kim, Kyungki-do (KR)

(73) Assignee: LG Electronics Inc., Seoul (KR)

( * ) Notice: Subject to any disclaimer, the term of this patent is extended or adjusted under 35 U.S.C. 154(b) by 23 days.

(21) Appl. No.: 10/025,887

(22) Filed: Dec. 26, 2001

(65) Prior Publication Data
US 2002/0084847 A1 Jul. 4, 2002

(30) Foreign Application Priority Data
Dec. 26, 2000 (KR) ........................................ 2000-81788

(51) Int. Cl.[7] .............................. H03F 1/00; H03F 1/26
(52) U.S. Cl. ...................................... 330/151; 330/149
(58) Field of Search .......................... 330/10, 149, 151; 375/297

(56) References Cited
U.S. PATENT DOCUMENTS 5,489,875 A * 2/1996 Cavers ....................... 330/151
5,594,385 A * 1/1997 Anvari ....................... 330/149
5,610,554 A * 3/1997 Anvari ....................... 330/52
6,240,144 B1 * 5/2001 Ha ............................. 375/297
6,396,344 B1 * 5/2002 Gentzler et al. ............ 330/149
6,531,918 B1 * 3/2003 Posner et al. ............... 330/149

* cited by examiner

Primary Examiner—Michael J. Tokar
Assistant Examiner—Linh V Nguyen
(74) Attorney, Agent, or Firm—Fleshner & Kim LLP

(57) ABSTRACT

According to a digital linearizing method, a digital input signal on a first path is operated with an output signal of a main amplifying unit, to thus detect distortion components included in the output signal of the main amplifying unit. A digital input signal on a second path is correlated with the detected distortion components, to thus adaptively control a gain of the digital input signal on the second path during the detection of the distortion components. Therefore, according to the above method, it is possible to effectively and correctly remove the distortion components included in the output signal of the main amplifying unit by amplifying the detected distortion components and coupling the amplified distortion components with the output signal of the main amplifying unit.

26 Claims, 3 Drawing Sheets

DIGITAL LINEARIZER OF HIGH POWER AMPLIFIER AND DIGITAL LINEARIZING METHOD

BACKGROUND OF THE INVENTION

1. Field of the Invention

The present invention relates to a feedforward linearizer, and more particularly to a digital linearizer of a power amplifier and a digital linearizing method thereof.

2. Background of the Related Art

In general, a high power amplifier (HPA) is used to increase the power of an input radio frequency (RF) signal. An ideal HPA does not distort the input RF signal while it amplifies the magnitude of the input RF signal. However, since the HPA generally consists of active elements having non-linear characteristics, an output signal from the HPA inevitably includes distortion components. Therefore, various linearizing technologies and algorithms for improving the non-linear characteristics of the HPA are provided in the related art. Representative linearizing methods include a predistortion method, an envelope feedback method, and a feedforward method.

FIG. 1 is a block diagram of a related art feedforward linearizer. As shown therein, the feedforward linearizer includes a divider 101 for dividing an input signal a main amplifying unit 102 for amplifying the divided input signal, and a directional coupler 105 for adding the input signal delayed by a delay 103 to the output signal of the main amplifying unit 102, which is divided by a divider 104. The distortion components included in the output signal of the main amplifying unit 102 are thus detected. The feedforward linearizer further includes an error amplifying unit 106 for amplifying the detected distortion components, and a directional coupler 108 for coupling the amplified distortion components to thus remove the distortion components.

The main amplifying unit 102 includes a variable attenuator 11 for attenuating an input signal, a variable phase shifter 12 for shifting the phase of the attenuated input signal, and a HPA 13 for amplifying the phase shifted input signal.

The error-amplifying unit 106 includes a variable attenuator 14 for attenuating the distortion components, a variable phase shifter 15 for shifting the phases of the attenuated distortion components, and an error amplifier 16 for amplifying the phase shifted distortion components.

In operation, an input signal is divided by the divider 101 and the divided signals pass through paths 17 and 18, respectively. The input signal that passes through the path 17 is amplified by the main amplifying unit 102. At this time, multiple harmonics components, that is, distortion components other than the input signal, exist in the output signal of the main amplifying unit 102 due to the non-linear characteristics of the HPA 13. The input signal that passes through the path 18 is delayed by the delay 103 and is inputted to the directional coupler 105. The time of delay 103 is set equal to the amount of time required for the operation of amplifying unit 102.

The first directional coupler 105 couples the output signal of the main amplifying unit 102 input through the divider 104 with the input signal delayed by the delay 103, to detect the distortion components included in the output signal of the main amplifying unit 102.

The input signal of the path 17 sequentially passes through the variable attenuator 11, the variable phase shifter 12, and the HPA 13 of the main amplifying unit 102, and is converted into a signal having a magnitude that is identical to the magnitude of the input signal of the path 17 and a phase that is opposite of the phase of the input signal of the path 17. That is, the phase is different from the phase of the input signal by 180°. Therefore, when the input signal of the path 17 is added to the input signal of the path 18 by the directional coupler 105, the original input signal disappears and only the distortion components exist.

The detected distortion components sequentially pass through the variable attenuator 14, the variable phase shifter 15, and the error amplifier 16 of the error amplifying unit 106. The distortion components are thus converted into signals having magnitudes that are identical to the magnitudes of the detected distortion components, and phases that are opposite to the phases of the detected distortion components. That is, phases are different from the phases of the detected distortion components by 180°. The converted signals are then inputted to the directional coupler 108. For the above process, the error amplifier 16 is designed to increase only the magnitude of the signal and not to generate the harmonics components.

The output signal of the main amplifying unit 102, which is divided by the divider 104, is delayed by the delay 107 by the time delay of the error-amplifying unit 106 and is input to the directional coupler 108. Therefore, when the output signal of the main amplifying unit 102 is coupled with the output signal of the error-amplifying unit 106 by the directional coupler 108, the distortion components, whose phases are 180° out of phase, offset each other. Accordingly, only the amplified input signal exists in the output signal of the directional coupler 108.

As mentioned above, the related art feedforward linearizer compensates for the non-linearity of the HPA by detecting the distortion components included in the output signal of the HPA and offsetting the distortion components included in the output signal of the HPA by the detected distortion components.

The feedforward linearizer of the related art has many problems and disadvantages. For example, if the time delay of the delay units 103 and 107 do not coincide with the time delay of the main amplifying unit and the time delay of the error amplifying unit, respectively, then the conventional feedforward linearizer can not effectively remove the distortion components.

In addition, if the related art feedforward linearizer does not correctly control the variable attenuator and the variable phase shifter, it cannot generate the output signal and the distortion signal of the main amplifying unit, whose phases are shifted by 180°.

Moreover, since the related art feedforward linearizer processes all of the signals in an analog way and, in particular, all of the signals are processed in a high frequency band, it is very difficult to correctly control the variable attenuator and the variable phase shifter. Additional circuits must inevitably be used in order to correctly control the variable attenuator and the variable phase shifter.

Furthermore, the non-linear characteristics of the HPA change according to time or external circumstances such as a temperature or bias. The related art feedforward linearizer cannot effectively compensate for such changes.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Another object of the present invention is to provide a digital linearizer of a HPA, which is capable of accurately detecting the distortion components included in the output signal of the HPA by a digital processing method, and a digital linearizing method.

Another object of the present invention is to provide a digital linearizer of a HPA, which is capable of adaptively coping with changes in the non-linear characteristics of the HPA, caused by time or external circumstances such as a temperature or bias, and a digital linearizing method.

In order to achieve at least the above objects in whole or in part, and in accordance with the purposes of the present invention, as embodied and broadly described herein, there is provided a digital linearizer including a main amplifying unit configured to amplify a digital input signal on a first path, a distortion component detecting unit coupled to receive the digital input signal on a second path and an output signal of the main amplifying unit and detect distortion components from the output signal of the main amplifying unit, and a correlating unit coupled to receive the digital input signal on a third path and the detected distortion components and configured to correlate the detected distortion components with the digital input signal to adaptively control the distortion component detecting unit.

To further achieve at least the above objects in whole or in part and in accordance with the purposes of the invention, as embodied and probably described, there is provided a digital linearizer, including a main amplifying unit configured to amplify a digital input signal on a first path, a distortion component detecting unit configured to process the digital input signal on a second path with an output signal of the main amplifying unit, and to detect distortion components from the output signal of the main amplifying unit, a correlating unit configured to correlate the detected distortion components with the digital input signal on a third path, to adaptively control the distortion component detecting unit, an error amplifying unit configured to amplify the detected distortion components, and a directional coupler configured to couple the output of the main amplifying unit with an output of the error amplifying unit to remove the distortion components included in the output signal of the main amplifying unit.

To further achieve at least the above objects in whole or in part and in accordance with the purposes of the invention, as embodied and probably described, there is provided a digital linearizing method, including amplifying a digital input signal on a first path, processing the amplified digital input signal of the first path with the digital input signal on a second path to detect a distortion component of the amplified digital input signal, and correlating the detected distortion components with the digital input signal on a third path to adaptively control a gain of the digital input signal on the second path.

To further achieve at least the above objects in whole or in part and in accordance with the purposes of the invention, as embodied and probably described, there is provided a digital linearizing method including amplifying a digital input signal on a first path to generate an amplified digital input signal, processing the amplified digital input signal with the digital input signal on a second path to detect distortion components of the amplified digital input signal, correlating the detected distortion components with the digital input signal on a third path, to adaptively control a gain of the digital input signal on the second path, amplifying the detected distortion components, and coupling the amplified digital input signal with the amplified distortion components to remove the distortion components included in the amplified digital input signal.

To further achieve at least the above objects in whole or in part and in accordance with the purposes of the invention, as embodied and probably described, there is provided a signal processing device, including a first digital-to-analog converter (DAC) configured to receive a digital input signal and convert the digital input signal into an analog input signal, a first hybrid divider coupled to receive the analog input signal and configured to divide the analog input signal into a first in-phase signal I and a first quadrature phase signal Q, first and second multipliers configured to multiply the first inphase signal I and the first quadrature phase signal Q by first and second components of a gain signal, respectively, a coupler coupled to the first and second multipliers and configured to combine the outputs of the first and second multipliers into a gain controlled analog input signal, a first analog-to-digital converter (ADC) configured to convert the gain controlled analog input signal into a gain controlled digital input signal.

To further achieve at, least the above objects in whole or in part and in accordance with the purposes of the invention, as embodied and probably described, there is provided a signal processing device, including a first digital-to-analog converter (DAC) configured to receive a delayed digital input signal and output a first analog delay signal, a first hybrid divider configured to divide the first analog delay signal into a first in-phase signal I and a first quadrature phase signal Q, a second DAC configured to receive the delayed detected distortion components and output a second analog delay signal, first and second multipliers configured to multiply each of the first in-phase signal I and the first quadrature phase signal Q by the second analog delay signal, and first and second magnitude calculators coupled to third and fourth multipliers, respectively, and configured to generate first and second components of a gain signal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

A preferred embodiment of the present invention will now be described with reference to the attached drawings.

Figure 1:
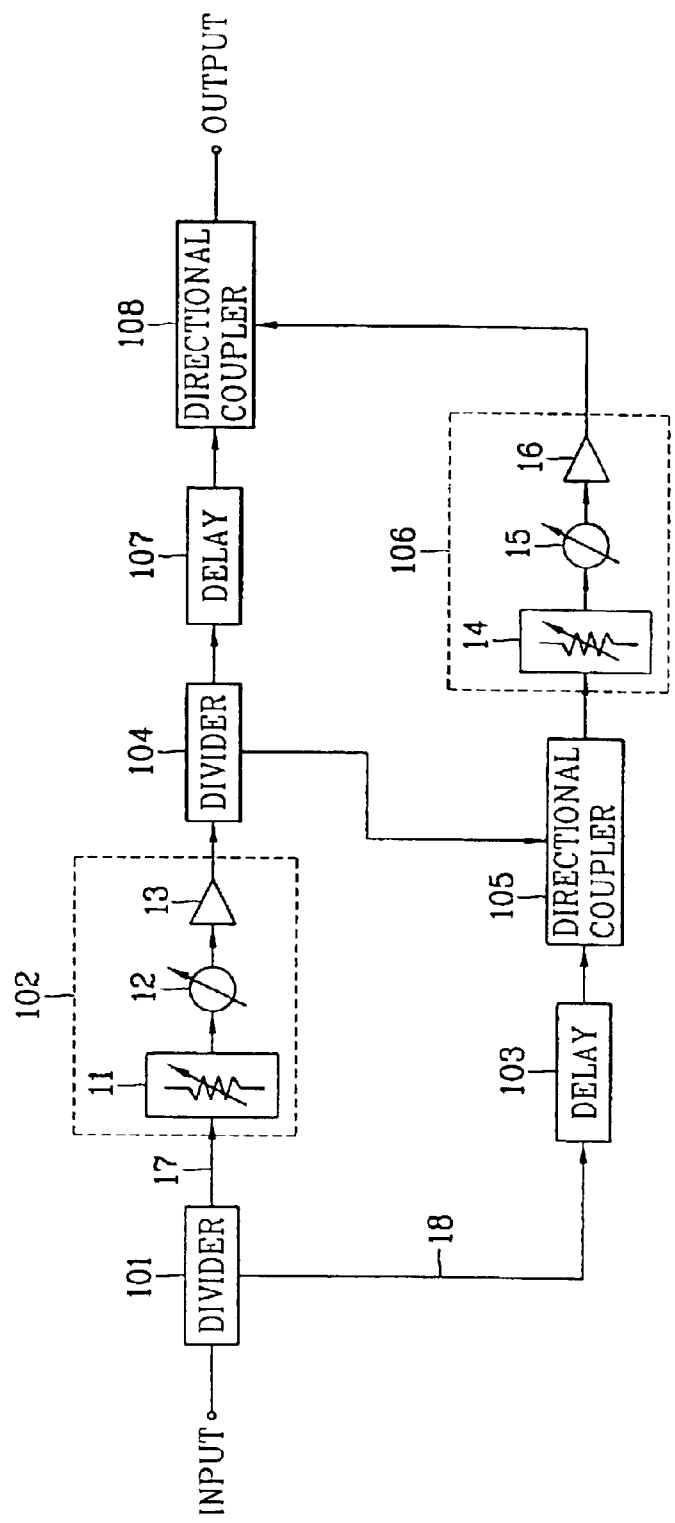
FIG. 1 is a block diagram of a related art feedforward linearizer.
Figure 2:
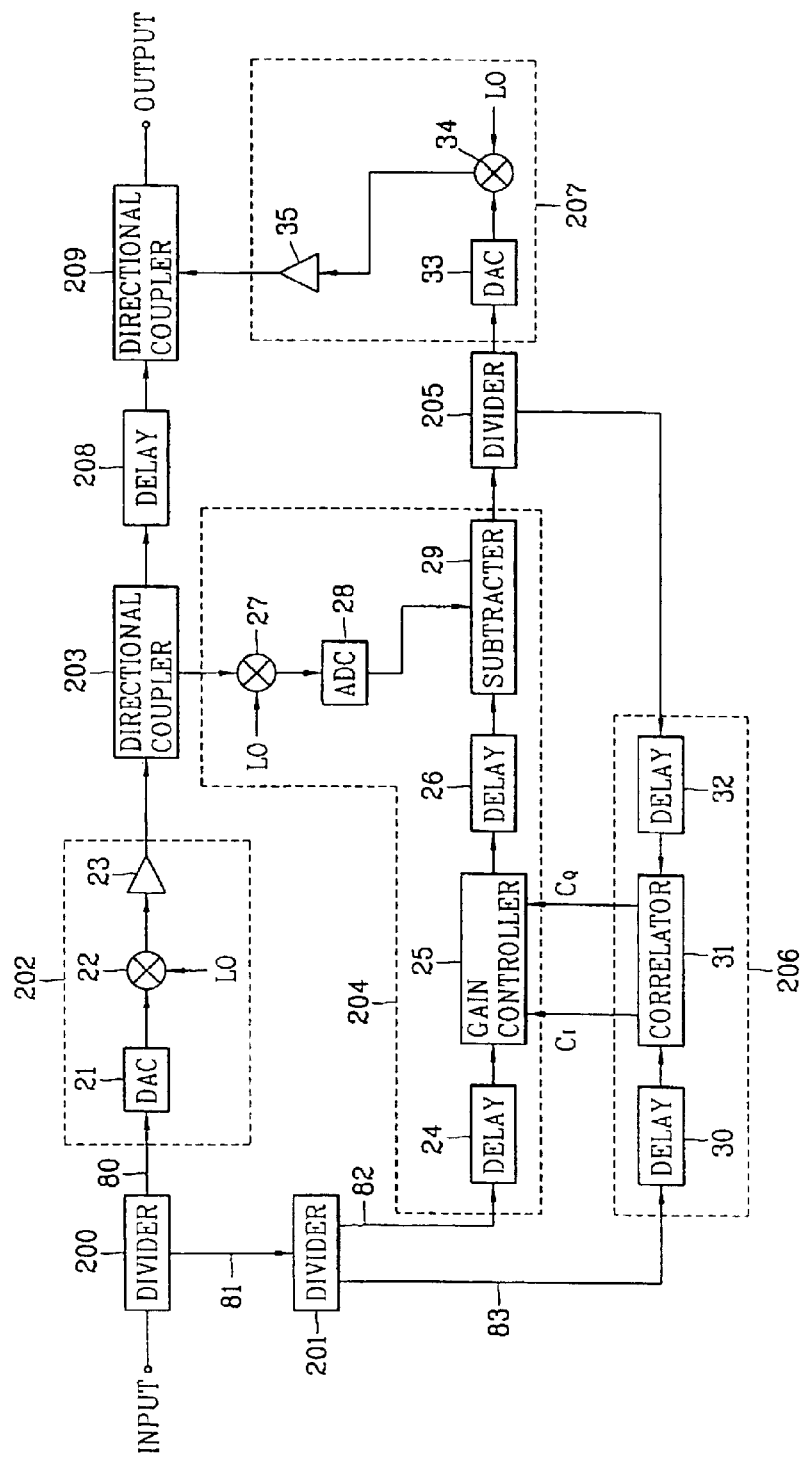
FIG. 2 is a block diagram of a digital linearizer of a high power amplifier (HPA) according to a preferred embodiment of the present invention.

FIG. 2 is a block diagram of a digital linearizer according to the preferred embodiment. As shown therein, the adaptive predistortion transmitter preferably includes dividers 200 and 201 to divide digital input signals, a main amplifying unit 202 to amplify in-phase and quadrature phase digital input signals I and Q divided by the divider 200, and a directional coupler 203 to sample the output signal of the main amplifying unit 202. The linearizer also preferably includes a distortion component detecting unit 204 for processing the output signal of the divider 201 and the output signal of the directional coupler 203, to thus detect the distortion components included in the output signal of the main amplifying unit 202. A divider 205 is preferably provided to divide the distortion components detected by the distortion component detecting unit 204, and a correlating unit 206 is preferably provided to correlate the output signals of the dividers 201 and 205 with each other, to thus control the operation of the distortion component detecting unit 204. The linearizer also preferably includes an error amplifying unit 207 to amplify the distortion components divided by the divider 205, and a directional coupler 209 to couple the output signal of the error amplifying unit 207 with the output signal of the directional coupler 203, which is input through a delay 208, to thus remove the distortion components included in the output signal of the main amplifying unit 202.

The main amplifying unit 202 preferably includes a digital-to-analog converter (DAC) 21 to convert the digital input signals I and Q into analog signals, a mixer 22 to up-convert the converted analog input signals into radio frequency (RF) signals, and a high power amplifier (HPA) 23 to amplify the RF signals output from the mixer 22.

The distortion component detecting unit 204 preferably includes a delay 24 to delay the digital input signals I and Q divided by the divider 201, a gain controller 25 to control the gains of the delayed digital input signals, and a delay 26 to delay the gain controlled digital input signals. The distortion component detecting unit 204 also preferably includes a mixer 27 to down-convert the output signal of the directional coupler 203 into an intermediate frequency (IF) signal according to a local oscillation (LO) signal, an analog-to-digital converter (ADC) 28 to convert the output signal of the mixer 27 into a digital signal, and a subtracter 29 to subtract the output signal of the ADC 28 from the output signal of the delay 26, to thus detect the distortion components included in the output signal of the main amplifying unit 202.

The correlating unit 206 preferably includes delays 30 and 32 to delay the digital input signals I and Q divided by the divider 201 and the distortion components divided by the divider 205 and a correlator 31 to correlate the output signals of the delays 30 and 32, to thus output gain control signals $C_I$ and $C_Q$ for controlling the gains of the digital input signals I and Q.

The error amplifying unit 207 preferably includes a digital to analog converter (DAC) 33 to convert the digital distortion components divided by the divider 205 into analog signals, a mixer 34 to up-convert the converted analog distortion components into RF signals, and an error amplifier 35 to amplify the RF distortion components output from the mixer 34.

In operation, the digital input signals I and Q are preferably divided by the divider 200 and the divided signals pass through paths 80 and 81, respectively. The digital input signals I and Q that pass through the path 80 are preferably input to the main amplifying unit 202. The digital input signals I and Q that pass through the path 81 are preferably divided by the divider 201 and the divided signals pass through paths 82 and 83.

The digital input signals I and Q that are inputted to the main amplifying unit 202 through the path 80 are preferably converted into analog signals by the DAC 21. The analog signals are preferably coupled with the LO signal by the mixer 22, are converted into RF signals, and amplified by the HPA 23. Many distortion components may be included in the output signal of the main amplifying unit 202 due to the nonlinear characteristics of the HPA 23.

The distortion component detecting unit 204 preferably subtracts the output signal of the main amplifying unit 202, which is sampled by the directional coupler 203, from the digital input signals I and Q on the path 82 in order to detect the distortion components. The correlating unit 206 then preferably correlates the digital input signals I and Q on the path 83 with the distortion components of the distortion component detecting unit 204, which are output from the divider 205, to thus output the gain control signals $C_I$ and $C_Q$ for controlling the gains of the digital input signals I and Q.

The gains of the digital input signals I and Q that pass through the path 82 are adaptively controlled by the gain control signals $C_I$ and $C_Q$ output from the correlating unit 206. Accordingly, the distortion component-detecting unit 204 can detect the distortion components from the output signal of the main amplifying unit 202.

When the distortion components are detected, the detected distortion components preferably pass through the divider 205 and are preferably input to the error-amplifying unit 207. The distortion components input to the error-amplifying unit 207 are preferably converted into analog signals by the DAC 33. The corresponding analog signals are preferably coupled with the oscillation signal LO by the mixer 34, converted into RF signals, and amplified by the HPA 35.

Therefore, the directional coupler 209 can effectively remove the distortion components included in the output signal of the main amplifying unit 202 by coupling the output signal of the main amplifying unit 202, which is input through the directional coupler 203 and the delay 208, with the distortion components amplified by the error amplifying unit 207.

As shown in FIG. 2, the gain controller 25 of the distortion component detecting unit 204 preferably controls the gains of the digital input signals I and Q delayed by the delay 24 according to the gain control signals $C_I$ and $C_Q$ output from the correlating unit 206.

Figure 3:
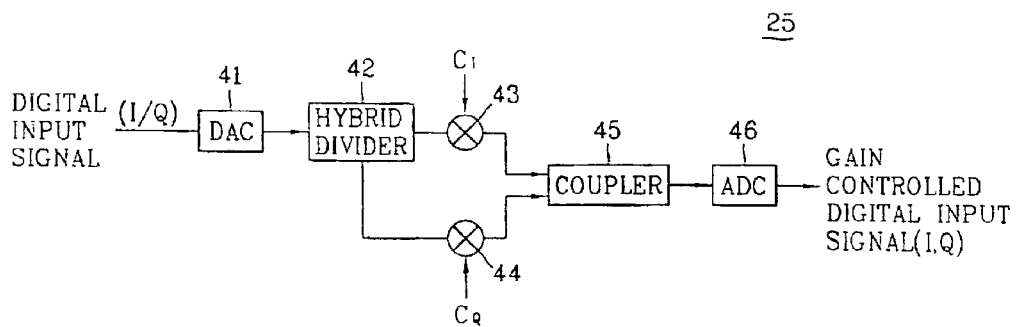
FIG. 3 is a detailed block diagram of a gain controller in FIG. 2 according to a preferred embodiment of the present invention.

FIG. 3 shows a preferred embodiment of the gain controller 25. As shown therein, the digital input signals I and Q are preferably converted into analog signals by a DAC 41 and are divided into the signal I and the signal Q by a hybrid divider 42. The signals I and Q are preferably multiplied by the gain control signals $C_I$ and $C_Q$ by multipliers 43 and 44, respectively. A coupler 45 preferably couples the gain-controlled signals I and Q with each other to form a digital input signal, and outputs the digital input signal to an ADC 46. The gain controlled digital input signal is preferably output from the ADC 46.

The gain controlled digital input signals I and Q are preferably delayed by the delay 26 and are applied to the subtracter 29. Also, the output signal of the main amplifying unit 202, which is sampled by the directional coupler 203, is preferably converted into a IF signal by the mixer 27, then is preferably converted into a digital signal by the ADC 28 and is preferably applied to the subtracter 29. The subtracter preferably subtracts the output signal of the ADC 28 from the output signal of the delay 26, to thus detect the distortion components included in the output signal of the main amplifying unit 202.

In addition to pure distortion components, a digital input signal component can exist in the output signal of the subtracter 29 due to the non-linear characteristics of the HPA 23 and the in exact control of the gain controller 25.

The correlator 31 of the correlating unit 206 preferably correlates the digital input signals I and Q on the path 83 with the distortion components output from the divider 205, to thus output the gain control signals $C_I$ and $C_Q$ for controlling the gains of the digital input signals I and Q.

Figure 4:
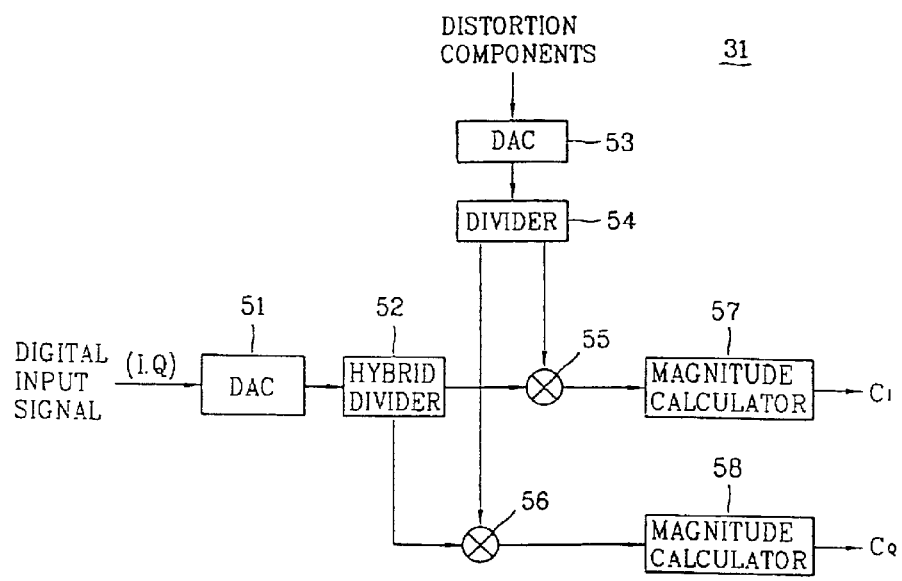
FIG. 4 is a detailed block diagram of a correlator in FIG. 2 according to a preferred embodiment of the present invention.

FIG. 4 shows a preferred embodiment of the correlator 31. As shown therein, the digital input signals I and Q are preferably converted into analog signals by a DAC 51 and are preferably divided into the signal I and the signal Q by a hybrid divider 52. The distortion components are preferably converted into analog signals by a DAC 53 and are preferably divided by a divider 54. The divided signals preferably pass through two different paths.

Multipliers 55 and 56 preferably multiply the divided signals I and Q by distortion signals, respectively, and output the multiplication results. Magnitude calculators 57 and 58 preferably calculate the magnitudes of the multiplication values of the multipliers 55 and 56, to thus output the gain control signals $C_I$ and $C_Q$. When the distortion components are not included in the output signal of the main amplifying unit 202, the output values of the multipliers 55 and 56 are preferably "0".

Therefore, the gains of the digital input signals I and Q that pass through the path 82 preferably are adaptively controlled by the gain control signals $C_I$ and $C_Q$ output from the correlating unit 206. Accordingly, the distortion component-detecting unit 204 can preferably detect the pure distortion components from the output signal of the main amplifier 202.

The preferred embodiment of the present invention provides many advantages. For example, it is possible to effectively compensate for the non-linear characteristics of the HPA by a digital processing method. In particular, according to the preferred embodiment, since signals are digitally processed, it is possible to correctly perform subtraction and to correct the subtraction result.

Also, according to a preferred embodiment of the present invention, it is possible to provide a more accurate and reliable linearizer by adapting to changes in the non-linear characteristics of the HPA caused by time or external circumstances such as a temperature or a bias.

Further, according to a preferred embodiment of the present invention, since the operations of all of the members excluding the main amplifying unit and the error-amplifying unit are performed in a low frequency band, the operations of the members can be easily controlled. For example, it is possible to compensate for the nonlinear characteristics of the HPA by digitally controlling the magnitude and the phase of a signal.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A digital linearizer comprising:
    a main amplifying unit configured to amplify a digital input signal on a first path;
    a distortion component detecting unit coupled to receive the digital input signal on a second path and an output signal of the main amplifying unit and detect distortion components from the output signal of the main amplifying unit; and
    a correlating unit coupled to receive the digital input signal on a third path and the detected distortion components and configured to correlate the detected distortion components with the digital input signal to adaptively control the distortion component detecting unit.

2. The digital linearizer of claim 1, wherein the distortion component detecting unit outputs a compensation signal that is applied to the amplified digital input signal to remove a distortion component.

3. The digital linearizer of claim 1, wherein the correlating unit is configured to adaptively control a gain of the digital input signal on the second path according to a level of the distortion components.

4. The digital linearizer of claim 1, further comprising:
    an error amplifying unit configured to amplify the detected distortion components received from the distortion component detection unit; and
    a directional coupler configured to couple the output signal of the main amplifying unit with an output signal of the error amplifying unit to remove the distortion components from the output signal of the main amplifying unit.

5. The digital linearizer of claim 1, wherein the distortion component detection unit comprises a gain controller configured to control a gain of the digital input signal on the second path according to a gain control signal output from the correlating unit.

6. The device of claim 5, wherein the gain controller is coupled to receive first and second gain control signals to individually control first and second components of the digital input signal.

7. The device of claim 6, wherein the first component of the digital input signal is an In-phase component I and wherein the second component of the digital input signal is a quadrature phase component Q.

8. The digital linearizer of claim 7, wherein the gain control signal comprises an in-phase gain control signal and a quadrature phase gain control signal.

9. The digital linearizer of claim 8, wherein the in-phase gain control signal and quadrature gain control signal are provided to a gain controller of the distortion component detecting unit to control a gain of the digital input signal on the second path.

10. The digital linearizer of claim 8, wherein the first gain control signal is an in-phase gain control signal, and wherein the second gain control signal is a quadrature phase gain control signal.

11. The digital linearizer of claim 5, wherein the distortion component-detecting unit further comprises:
    a first delay configured to delay the second digital input signal on the second path and to provide a delayed digital input signal to the gain controller;
    a second delay configured to delay an output signal of the gain controller;
    a mixer configured to convert the output signal of the main amplifying unit into an intermediate frequency (IF) signal;

an analog-to-digital converter (ADC) configured to convert the IF signal to an intermediate digital signal; and a subtracter configured to subtract the intermediate digital signal from the gain controlled digital input signal to detect the distortion components.

12. The digital linearizer of claim 11, wherein the gain controller comprises:

a digital analog converter (DAC) configured to convert the delayed digital input signal into a delayed analog input signal;

a hybrid divider configured to divide the delayed analog input signal into an in-phase signal I and a quadrature phase signal Q;

first and second multipliers configured to multiply the in-phase signal I by an in-phase component of the gain control signal and multiply the quadrature phase signal Q by a quadrature phase component of the gain control signal, respectively;

a coupler configured to couple an output of the first multiplier with an output of the second multiplier; and an analog-to-digital converter (ADC) configured to convert an analog output of the coupler to the gain-controlled digital signal.

13. The digital linearizer of claim 1, wherein the correlating unit comprises:

a first delay configured to delay the digital input signal on the third path;

a second delay configured to delay the detected distortion components; and a correlator configured to correlate an output of the first delay with an output of the second delay to generate a gain control signal.

14. The digital linearizer of claim 13, wherein the correlator comprises:

a first digital-to-analog converter (DAC) configured to convert the output of the first delay into a first analog delay signal;

a hybrid divider configured to divide the first analog delay signal into an in-phase signal I and a quadrature phase signal Q;

a second DAC configured to convert the output of the second delay into a second analog delay signal;

first and second multipliers configured to multiply the in-phase signal I by the second analog delay signal and multiply the quadrature phase signal Q by the second analog delay signal, respectively; and first and second magnitude calculators configured to calculate a magnitude of output signals of each of the first and second multipliers, to generate first and second gain control signals.

15. A digital linearizer, comprising:

a main amplifying unit configured to amplify a digital input signal received on a first path;

a distortion component detecting unit configured to process the digital input signal received on a second path with an output signal of the main amplifying unit, and to detect distortion components from the output signal of the main amplifying unit;

a correlating unit configured to correlate the detected distortion components with the digital input signal received on a third path, to adaptively control the distortion component detecting unit;

an error amplifying unit configured to amplify the detected distortion components; and a directional coupler configured to couple the output of the main amplifying unit with an output of the error amplifying unit to remove the distortion components included in the output signal of the main amplifying unit.

16. The digital linearizer of claim 15, wherein the distortion component-detecting unit comprises:

a first delay configured to delay the digital input signal on the second path;

a gain controller configured to control the gain of the digital input signal on the second path according to a gain control signal output from the correlating unit;

a second delay configured to delay an output signal of the gain controller;

a mixer configured to convert an output signal of the main amplifying unit into an IF signal;

an analog to digital converter (ADC) configured to convert the IF signal to an intermediate digital signal; and a subtracter configured to subtract the intermediate digital signal from the gain controlled digital input signal to detect the distortion components.

17. The digital linearizer of claim 15, wherein the correlating unit comprises:

a first delay configured to delay the digital input signal on the third path;

a second delay configured to delay the detected distortion components; and a correlator configured to correlate the output of the first delay with the output of the second delay, to generate a gain control signal.

18. The digital linearizer of claim 17, wherein the correlator comprises:

a first digital-to-analog converter (DAC) configured to convert the output of the first delay into a first analog delay signal;

a hybrid divider configured to divide the first analog delay signal into an in-phase signal I and a quadrature phase signal Q;

a second DAC configured to convert the output of the second delay into a second analog delay signal;

first and second multipliers configured to multiply the in-phase signal I by the second analog delay signal and multiply the quadrature phase signal Q by the second analog delay signal, respectively; and first and second magnitude calculators configured to calculate a magnitude of the output signals of each of the first and second multipliers, to generate first and second gain control signals.

19. The digital linearizer of claim 16, wherein the gain controller comprises:

a digital-to-analog converter (DAC) configured to convert the delayed digital input signal into a delayed analog input signal;

a hybrid divider configured to divide the delayed analog input signal into an in-phase signal I and a quadrature signal Q;

first and second multipliers configured to multiply the in-phase signal I by an in-phase component of the gain control signal and multiply the signal Q by a quadrature phase component of the gain control signal, respectively;

a coupler configured to couple an output of the first multiplier with an output of the second multiplier; and an analog-to-digital converter (ADC) configured to convert an analog output of the coupler to the gain controlled digital signal.

20. A digital linearizing method, comprising:

amplifying a digital input signal received on a first path;

processing the amplified digital input signal of the first path with the digital input signal received on a second path to detect a distortion component of the amplified digital input signal; and correlating the detected distortion components with the digital input signal received on a third path to adaptively control a gain of the digital input signal on the second path.

21. The method of claim 20, further comprising:

amplifying the detected distortion components; and coupling the amplified digital input signal of the first path with the amplified distortion components to remove the distortion components included in the amplified digital input signal of the first path.

22. The method of claim 20, wherein processing comprises:

controlling a gain of the digital input signal on the second path according to a gain control signal;

converting the amplified digital input signal of the first path into an IF signal and converting the IF signal into an intermediate digital signal; and subtracting the intermediate digital signal from the gain controlled digital input signal of the second path, to detect the distortion components.

23. The method of claim 20, wherein correlating comprises:

converting the digital input signal on the third path into a first analog signal;

dividing the first analog signal into an in-phase signal I and a quadrature phase signal Q;

converting the detected distortion components into a second analog signals;

multiplying the in-phase signal I and the quadrature phase signal Q by the second analog signals; and calculating a magnitude of each of the multiplications, to generate in-phase and quadrature phase components of the gain of the digital input signal on the second path.

24. A digital linearizing method comprising:

amplifying a digital input signal received on a first path to generate an amplified digital input signal;

processing the amplified digital input signal with the digital input signal received on a second path to detect distortion components of the amplified digital input signal;

correlating the detected distortion components with the digital input signal received on a third path, to adaptively control a gain of the digital input signal on the second path;

amplifying the detected distortion components; and coupling the amplified digital input signal with the amplified distortion components to remove the distortion components included in the amplified digital input signal.

25. The method of claim 24, wherein processing comprises:

controlling a gain of the digital input signal according to a gain control signal;

converting the amplified digital input signal into an IF signal;

converting the IF signal into an intermediate digital signal; and subtracting the intermediate digital signal from the gain controlled digital input signal on the second path, to detect the distortion components.

26. The method of claim 24, wherein correlating comprises:

converting the digital input signal on the second path into a first analog signal;

dividing the first analog signal into an in-phase signal I and a quadrature phase signal Q;

converting the detected distortion components into a second analog signal and dividing the second analog signal;

multiplying the in-phase signal I and the quadrature phase signal Q by the second analog signal; and calculating a magnitude of each of the multiplications, to generate the in-phase and quadrature phase components of the gain control signal for the digital input signal on the second path.

* * * * *